US012750958B2

(12) United States Patent
Zhang et al.

(10) Patent No.: US 12,750,958 B2
(45) Date of Patent: Sep. 29, 2026

(54) AVIATION CONNECTOR AND DISPLAY SCREEN

(71) Applicant: SHENZHEN GLOSHINE TECHNOLOGY CO., LTD., Shenzhen (CN)

(72) Inventors: Xianfeng Zhang, Shenzhen (CN); Guoqiang Li, Shenzhen (CN); Yongfeng Guo, Shenzhen (CN); Xinyong Chen, Shenzhen (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 74 days.

(21) Appl. No.: 19/057,941

(22) Filed: Feb. 19, 2025

(65) Prior Publication Data

US 2026/0163289 A1 Jun. 11, 2026

Related U.S. Application Data

(63) Continuation of application No. PCT/CN2024/137760, filed on Dec. 9, 2024.

(30) Foreign Application Priority Data

Dec. 5, 2024 (CN) ......................... 202411781092.1

(51) Int. Cl.
*H05K 5/02* (2006.01)
*H01R 13/447* (2006.01)
*H01R 13/52* (2006.01)

(52) U.S. Cl.
CPC ............. *H05K 5/02* (2013.01); *H01R 13/447* (2013.01); *H05K 5/0247* (2013.01); *H01R 13/5213* (2013.01); *H01R 2201/26* (2013.01)

(58) Field of Classification Search
CPC ...... H05K 5/02; H05K 5/0247; H01R 13/447; H01R 13/5213; H01R 2201/26; G09F 9/301; G06F 1/1601; G06F 1/1637
See application file for complete search history.

(56) References Cited

U.S. PATENT DOCUMENTS 5,595,496 A * 1/1997 Konda ............... H01R 13/5219 439/271
10,490,931 B2 * 11/2019 Furuya ............... H01R 13/5208
(Continued)

FOREIGN PATENT DOCUMENTS

CN 205790857 U 12/2016
CN 210897808 U 6/2020
(Continued)

OTHER PUBLICATIONS

Machine translation of CN216435383 (Year: 2026).*

*Primary Examiner* — Sagar Shrestha

(57) ABSTRACT

Provided is an aviation connector, includes an outlet body and a first cover plate; the outlet body includes a shaft section, second cover plate, conductive structure and power supply conductor; the shaft section includes an input end and an output end; the input end is provided with an input terminal, and the output end is provided with an output terminal; an end of the power supply conductor and the conductive structure are integrally formed in the shaft section, the conductive structure is electrically connected with the input terminal and output terminal, the power supply conductor is electrically connected with the input terminal, and another end of the power supply conductor passes through the shaft section; one of the input end or output end passes through the through hole of the first cover plate, and the other of the input end or output end is connected with the second cover plate.

10 Claims, 3 Drawing Sheets

(56) References Cited

U.S. PATENT DOCUMENTS

| | | | | |
|---|---|---|---|---|
| 2007/0025809 | A1* | 2/2007 | Lee | B64F 1/06 403/119 |
| 2022/0263266 | A1* | 8/2022 | Zhang | B64U 50/19 |
| 2026/0163294 | A1* | 6/2026 | Zhang | H01R 13/5202 |

FOREIGN PATENT DOCUMENTS

| | | | |
|---|---|---|---|
| CN | 212323372 | U | 1/2021 |
| CN | 216389973 | U | 4/2022 |
| CN | 216435383 | U | 5/2022 |
| CN | 218975885 | U | 5/2023 |
| CN | 221176722 | U | 6/2024 |
| DE | 202014103778 | U1 | 9/2014 |

* cited by examiner

AVIATION CONNECTOR AND DISPLAY SCREEN

CROSS REFERENCE TO RELATED APPLICATIONS

The present application is a Continuation Application of PCT Application No. PCT/CN2024/137760 filed on Dec. 9, 2024, which claims the benefit of Chinese Patent Application No. 202411781092.1 filed on Dec. 5, 2024. All the above are hereby incorporated by reference in their entirety.

TECHNICAL FIELD

The application belongs to the technical field of electrical outlet, in particular to an aviation connector and display screen.

BACKGROUND

An aviation connector is a type of connecting device that connects several power lines in a specific order to join or disconnect circuits. Large display panels are connected by many unit display screens, and each unit display screen requires power input. When a plurality of unit display screens are spliced, the aviation connector connects the power lines of adjacent LED display screens in series and provides power input to the unit display screens.

The existing aviation connector usually includes a plug and a socket. Because the existing aviation connector usually includes a plug and a socket, two separate sockets are required to be installed on the housing of the unit display screen, one for power supply input and the other for power supply output. However, a wiring position needs to be provided between the two separate sockets, resulting in a large occupation space.

APPLICATION CONTENT

The present application provides an aviation connector and a display screen in order to address the issue of the requirement to reserve a wiring position between two sockets on the current display screen, which results in a huge occupied space.

In order to solve the above technical problems, in an aspect, the embodiment of the application provides an aviation connector, including an outlet body and a first cover plate arranged separately, wherein the outlet body includes a shaft section, a second cover plate, a conductive structure and a power supply conductor; the shaft section includes an input end and an output end, the input end and the output end are oppositely arranged along an axial direction of the shaft section, wherein the input end is provided with an input terminal extending along the axial direction of the shaft section, and the output end is provided with an output terminal extending along the axial direction of the shaft section;

an end of the power supply conductor and the conductive structure are integrally formed in the shaft section, the conductive structure is electrically connected with the input terminal and the output terminal; an end of the power supply conductor is electrically connected with the input terminal, and another end of the power supply conductor passes through the shaft section; and the first cover plate is provided with a through hole, one of the input end or the output end passes through the through hole, and another one of the input end or the output end is connected with the second cover plate.

Optionally, the power supply conductor is a wire, and the wire includes a neutral wire, a hot wire and a ground wire.

Optionally, the second cover plate is integrally formed on an outer peripheral surface of the shaft section.

Optionally, the aviation connector further includes a first waterproof cover arranged at the input end, the first waterproof cover includes a first connecting belt and a first cover body, the first connecting belt connects a sidewall of the shaft section and the first cover body, and the first cover body is able to be folded and sealed at the input end.

Optionally, an end of the first connecting belt is provided with a first connecting sleeve, and the first connecting sleeve is provided on the outer peripheral surface of the shaft section.

Optionally, the input end is provided with an input hole extending along the axial direction of the shaft section, and a first annular gap is arranged between an inner wall of the input hole and the input terminal; and a first connecting ring is arranged on an end face of the first cover body, the first connecting ring is convex, and a central line of the first connecting ring is parallel to a central axis of the shaft section; the first connecting ring is able to be clamped in the first annular gap.

Optionally, the aviation connector further includes a second waterproof cover arranged at the output end, wherein the second waterproof cover includes a second connecting belt and a second cover body, the second connecting belt connects the sidewall of the shaft section and the second cover body, and the second cover body is able to be folded and sealed at the output end.

Optionally, an end of the second connecting belt is provided with a second connecting sleeve, and the second connecting sleeve is sleeved on the outer peripheral surface of the shaft section.

Optionally, the output end is provided with an output hole extending along the axial direction of the shaft section, and a second annular gap is arranged between an inner wall of the output hole and the output terminal; and a second connecting ring is arranged on an end face of the second cover body, and a central line of the second connecting ring is parallel to the central axis of the shaft section; the second connecting ring is able to be clamped in the second annular gap.

In another aspect, the application provides a display screen, including a plurality of unit display screens and a plurality of aviation connectors of any one of claims 1-9, wherein a housing of each unit display screen is provided with the aviation connector, and the power supply conductor of each aviation connector is electrically connected with the input end of an internal power supply of the unit display screen; and along an arrangement direction of the plurality of aviation connectors, the input end of the first aviation connector is electrically connected with an external power supply, and the output end of the first aviation connector is electrically connected with the input end of the aviation connector on the next unit display screen; the input end of the last aviation connector is electrically connected with the output end of the aviation connector on the last unit display screen.

According to the aviation connector-in of the application, the input end, the conductive structure, and the output end are integrally formed on the shaft section, and the conductive structure is electrically connected with the input end and the output end, saving the wire connection. Moreover, the input end and the output end are oppositely arranged along the axial direction of the shaft section, and the input terminal of the input end and the output terminal of the output end both extend along the axial direction of the shaft section, so the input end and the output end are located on the same straight line. The conductive structure does not have to bend or change direction, allowing for a more compact design of the space between the input end and output end. This reduces the size of the aviation connector, which in turn makes installation and arrangement easier.

Figure 1:
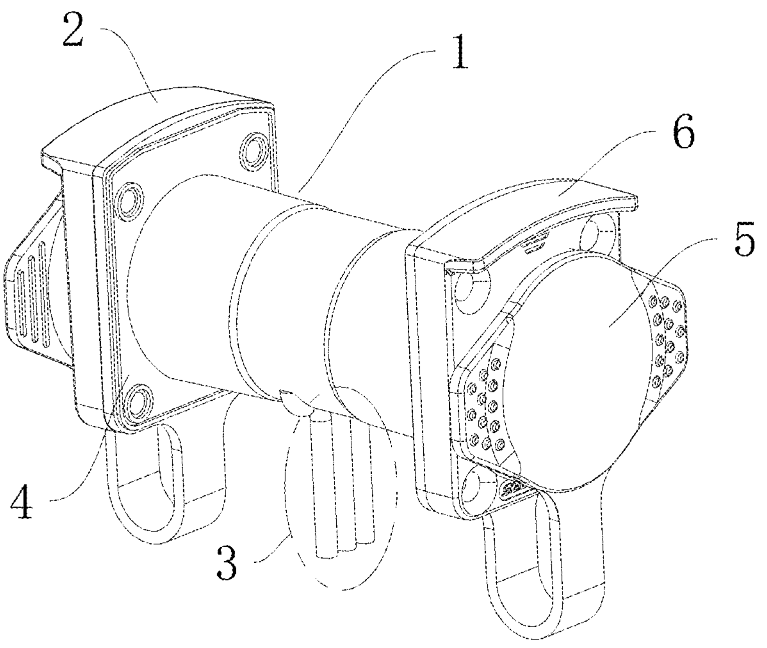
FIG. 1 is a structural schematic diagram of an aviation connector provided by an embodiment of the present application.

The reference signs in the drawings are as follows.

100. Unit display screen; 101. Mounting base; 1. Shaft section; 11. Input end; 12. Output end; 2. First cover plate; 21. Through hole; 22. First connecting hole; 3. Power supply conductor; 4. First waterproof cover; 41. First cover body; 42. First connecting belt; 43. First connecting sleeve; 44. First connecting ring; 45. First operating handle; 5. Second waterproof cover; 51. Second cover body; 52. Second connecting belt; 53. Second connecting sleeve; 54. Second connecting ring; 55. Second operating handle; 6. Second cover plate; 61. Second connecting hole.

DETAILED DESCRIPTION OF THE DISCLOSED EMBODIMENTS

In order to make the technical problems to be solved, technical solutions and beneficial effects of this application more clear, the following is a more complete description of the application, including embodiments and drawings. It should be noted that the specific embodiments described below are simply utilized to clarify the application, not to limit the application.

Because the existing aviation connector typically consists of a plug and a socket, two independent sockets must be installed on the housing of the unit display screen, one for power input and the other for power output, and a wiring position must be left between the two sockets, resulting in the problem of large space occupation. To address the aforementioned issues, the application provides an aviation connector.

Figure 2:
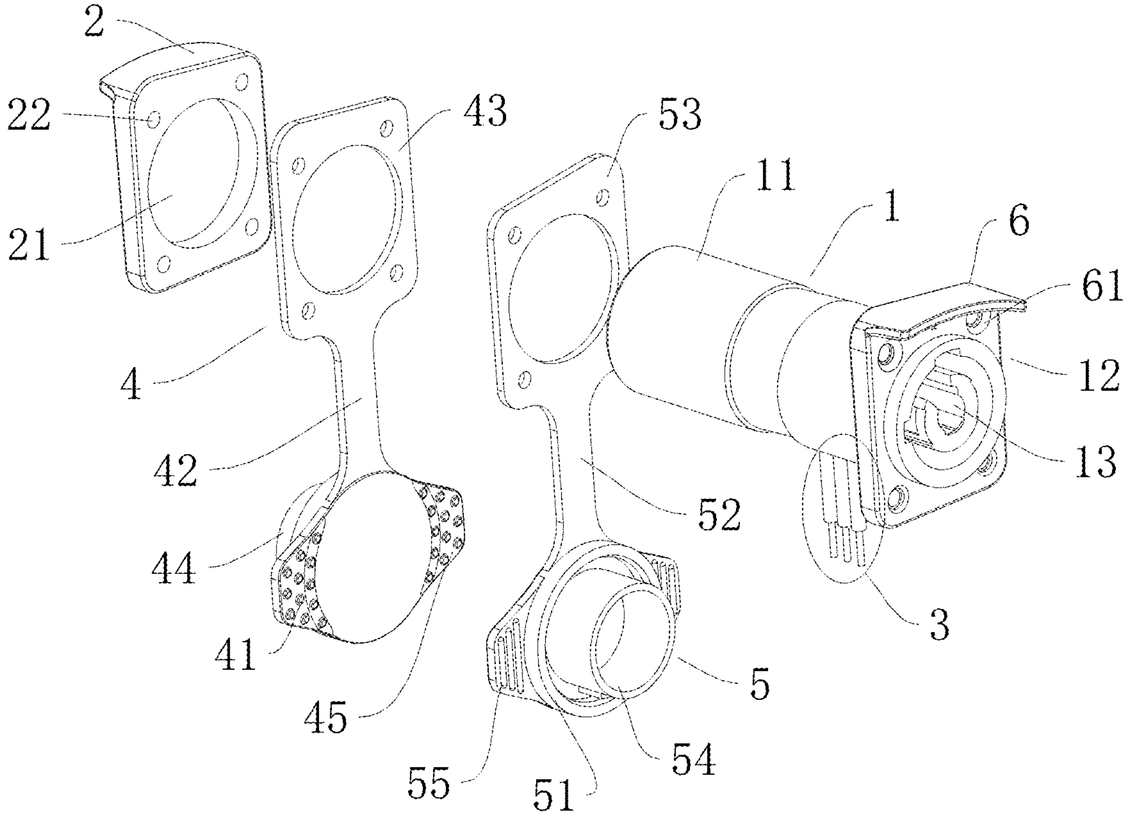
FIG. 2 is an exploded view of FIG. 1.

As shown in FIG. 1 and FIG. 2, an aviation connector provided by an embodiment of the application includes an outlet body and a first cover plate 2 which are separately arranged; the outlet body includes a shaft section 1, a second cover plate 6, a conductive structure and a power supply conductor 3; the shaft section 1 includes an input end 11 and an output end 12 which are oppositely arranged along its axial direction. The input end 11 is provided with an input terminal extending along its axial direction, and the output end 12 is provided with an output terminal extending along its axial direction.

An end of the power supply conductor 3 and the conductive structure are integrally formed in the shaft section 1, and the conductive structure is electrically connected with the input terminal and the output terminal, and an end of the power supply conductor 3 is electrically connected with the input end. The other end of the power supply conductor 3 passes through the shaft section 1 and is used for electrically connecting the input end of the internal power supply of the unit display screen 100 where the power supply is plugged in.

The aviation connector of power supply is used to connect two separate sockets into a set, so that a set of socket and plug can realize the functions of power supply input and power supply output at the same time. The specific connection method is: the two sockets are connected back to back, and the power supply conductor 3 is led out from the inside to connect the internal power supply of the unit display screen 100.

The first cover plate 2 is provided with a through hole 21, one of the input end 11 or the output end 12 passes through the through hole 21, and the other of the input end 11 or the output end 12 is connected with the second cover plate 6. The first cover plate 2 and/or the second cover plate 6 are adapted to connect the housing of the unit display screen 100 where the aviation connector is located, so as to fix the aviation connector on the housing of the unit display screen 100.

Because the shaft section 1 and the first cover plate 2 are separately arranged, when installing the aviation connector on the housing of the unit display screen 100, first, an end of the shaft section 1 passes through the mounting hole on the housing; then, the first cover plate 2 is sleeved on the end of the shaft section 1 that passes through the installation hole; and finally, the first cover plate 2 and/or the second cover plate 6 are connected to the housing of the unit display screen 100.

The input end 11, the conductive structure and the output end 12 of the aviation connector are integrally formed on the shaft section 1, and the conductive structure is electrically connected with the input end 11 and the output end 12, thus saving wire connection. Furthermore, the input end 11 and the output end 12 are oppositely arranged along the axial direction of the shaft section 1, and the input terminal of the input end 11 and the output terminal of the output end 12 both extend along the axial direction of the shaft section 1. Therefore, the input end 11 and the output end 12 are positioned on the same straight line, and the conductive structure does not need to be bent, allowing the input end 11 and output end 12 to be designed to be more compact, reducing the size of the aviation connector, further reducing the aviation connector's occupied space, and making installation and arrangement easier.

In an embodiment, as shown in FIG. 2, the power supply conductor 3 is a wire, and the wire includes a neutral wire, a hot wire and a ground wire.

In other embodiments, the power supply conductor 3 may be replaced by other conductors, including but not limited to copper sheets, aluminum wires, etc.

In an embodiment, the second cover plate 6 is integrally formed on the outer peripheral surface of the shaft section 1, which reduces the steps of assembling the aviation connector and improves the assembly efficiency.

In other embodiments, the second cover plate 6 can be separated from the shaft section 1. In this state, the second cover plate 6 is provided with a through hole for the shaft section 1 to pass through.

In an embodiment, the first cover plate 2 is square, and four corners of the first cover plate 2 are provided with a first connecting hole 22 penetrating along the axial direction of the shaft section 1. Correspondingly, the housing of the unit display screen 100 is provided with four first threaded holes which are communicated with the first connecting holes 22, and each first connecting hole 22 is internally connected with a screw.

In an embodiment, the second cover plate 6 is square, and the four corners of the second cover plate 6 are provided with a second connecting hole 61 penetrating along the axial direction of the shaft section 1. Correspondingly, the housing of the unit display screen 100 is provided with four second threaded holes which are communicated with the second connecting holes 61, and each second connecting hole 61 is internally connected with a screw.

In other embodiments, the positions of the input end 11 and the output end 12 can be interchanged. It is not limited to that shown in the figures, i.e., the left end is input end 11 or the right end is input end 11.

In an embodiment, it also includes a first waterproof cover 4, which is arranged at the input end 11 and includes a first connecting belt 42 and a first cover body 41. The first connecting belt 42 connects the sidewall of the shaft section 1 and the first cover body 41. The first cover body 4 can be folded and sealed at the input end 11. When the input end 11 is not in use, the first cover body 41 is sealed on the input end 11 to prevent water from dripping on the input end in wet and rainy environment, thus improving the waterproof performance and safety of aviation connector.

In an embodiment, an end of the first connecting belt 42 is provided with a first connecting sleeve 43, and the first connecting sleeve 43 is sleeved on the outer peripheral surface of the shaft section 1.

The first waterproof cover 4 and the shaft section 1 are separately arranged, and the first waterproof cover 4 is sleeved on the shaft section 1 through the first connecting sleeve 43 without other connectors, thus the structure is simple. Moreover, the connection strength between the first waterproof cover 4 and shaft section 1 is high, and the service life of first waterproof cover 4 is long.

In one embodiment, the first waterproof cover 4 is usually made of soft rubber.

In an embodiment, the first cover body 41 is round, and the end edge of the first cover body 41 is provided with a first operating handle 45 protruding radially outward, and the first operating handle 45 is used for drawing the first waterproof cover 4.

In an embodiment, the input end 11 is provided with an input hole extending along the axial direction of the shaft section 1, and a first annular gap is arranged between an inner wall of the input hole and the input terminal; and a first connecting ring 44 is arranged on an end face of the first cover body 41, the first connecting ring 44 is convex, and a central line of the first connecting ring 44 is parallel to a central axis of the shaft section 1; the first connecting ring 44 is able to be clamped in the first annular gap to seal the first cover body 41 on the input end 11.

In an embodiment, the second waterproof cover 5 is also included, and the second waterproof cover 5 is arranged at the output end 12. The second waterproof cover 5 includes a second connecting belt 52 and a second cover body 51. The second connecting belt 52 connects the side wall of the shaft section 1 and the second cover body 51, and the second cover body 51 can be folded and sealed at the output end 12.

When the output end 12 is not used, the second cover body 51 is sealed in the output end 12 to prevent water from dripping on the output end in wet and rainy environment, thus improving the waterproof performance and safety of the aviation connector.

In an embodiment, an end of the second connecting belt 52 is provided with a second connecting sleeve 53, and the second connecting sleeve 53 is sleeved on the outer peripheral surface of the shaft section 1.

The second waterproof cover 5 and the shaft section 1 are separately arranged, and the second waterproof cover 5 is sleeved on the shaft section 1 through the second connecting sleeve 53 without other connectors, thus the structure is simple. The connection strength between second waterproof cover 5 and shaft section 1 is high, and the service life of second waterproof cover 5 is long.

In an embodiment, the first waterproof cover 4 and the second waterproof cover 5 are made of soft rubber.

In an embodiment, the output end 12 is provided with an output hole extending along the axial direction of the shaft section 1, and a second annular gap is arranged between an inner wall of the output hole and the output terminal; and a second connecting ring 54 is arranged on an end face of the second cover body 51, and a central line of the second connecting ring 54 is parallel to the central axis of the shaft section 1; the second connecting ring 54 is able to be clamped in the second annular gap to seal the second cover body 51 at the output end 12.

In an embodiment, the second cover body 51 is round, and the end edge of the second cover body 51 is provided with a second operating handle 55 protruding radially outward, and the second operating handle 55 is used for drawing the second waterproof cover 5.

In an embodiment, the structures of the first waterproof cover 4 and the second waterproof cover 5 are the same.

Figure 3:
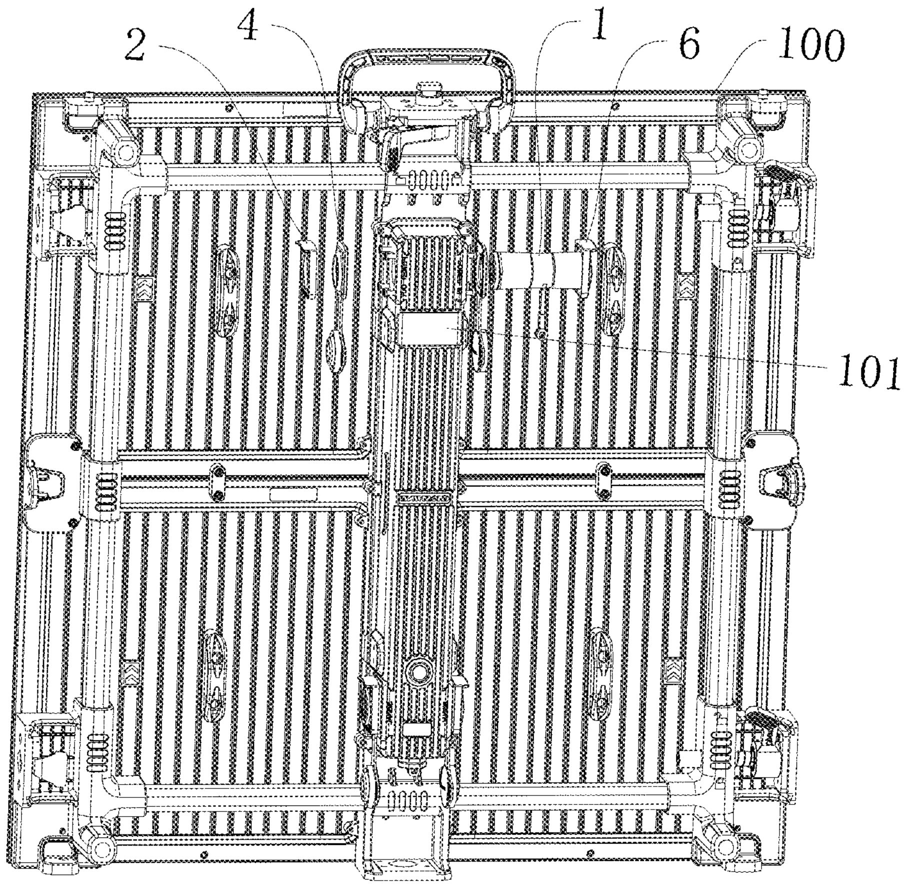
FIG. 3 is a structural schematic diagram of the aviation connector installed on the unit display screen, which is shown in FIG. 1.
Figure 4:
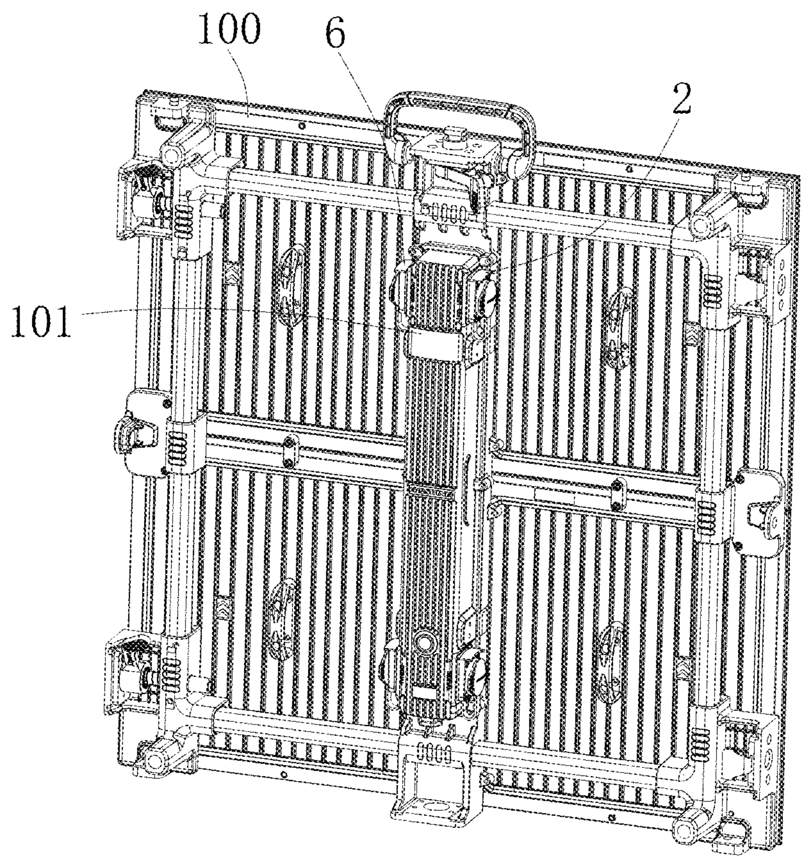
FIG. 4 is an exploded view of FIG. 3.

In an embodiment, as shown in FIGS. 3 and 4, the first cover plate 2 is sleeved at the input end 11, and the second cover plate 6 is integrally formed at the output end 12. The first connecting sleeve 43 is provided with a first through hole corresponding to the first connecting hole 22 on the first cover plate 2, and the second connecting sleeve 53 is provided with a second through hole corresponding to the second connecting hole 61 on the second cover plate 6.

A mounting base 101 is arranged on the back of the housing of unit display screen 100, and mounting holes are arranged on the mounting base 101. When installing the aviation connector on the housing of the unit display screen 100, first sleeve the second connecting sleeve 53 on the output end 12 of the shaft section 1 and attach it on the second cover plate 6 in alignment. Then insert the input end 11 of the shaft section 1 through the mounting hole on the mounting base 101 until the second connecting sleeve 53 is attached to the mounting base 101, and install the screws in the second connecting hole 61. Then, after the first connecting sleeve 43 is sleeved on the input end 11 of the shaft section 1 and attached in alignment to the side of the mounting base 101 facing away from the second cover plate 6, sleeve the first cover plate 2 on the shaft section 1 until the first cover plate 2 is attached on the first connecting sleeve 43 in alignment. Finally, install the screws in the first connecting hole 22.

In an embodiment, the shape of the first connecting sleeve 43 is the same as that of the first cover plate 2, and the shape of the second connecting sleeve 53 is the same as that of the second cover plate 6.

In other embodiments, it may be a housing where only the first cover plate 2 is connected to the unit display screen 100, or it may be a housing where only the second cover plate 6 is connected to the unit display screen 100.

In other embodiments, an end of the first connecting belt 42 or an end of the second connecting belt 52 can be fixed on the side wall of the shaft section 1 by plastic welding.

In addition, an embodiment of the application provides a display screen, including a plurality of unit display screens 100 and a plurality of aviation connectors of any one of the above embodiments; a housing of each unit display screen is provided with the aviation connector, and the power supply conductor 3 of each aviation connector is electrically connected with the input end of an internal power supply of the unit display screen 100; and along an arrangement direction of the plurality of aviation connectors, the input end 11 of the first aviation connector is electrically connected with an external power supply, and the output end 12 of the first aviation connector is electrically connected with the input end of the aviation connector on the next unit display screen 100; the input end 11 of the last aviation connector is electrically connected with the output end 12 of the aviation connector on the last unit display screen 100.

The above are merely the preferred embodiments of this application, and they are not intended to limit it. Any modification, equivalent substitution and improvement made in accordance with the spirit and principles of this application shall be included within the protection scope of this application.

What is claimed is:

1. An aviation connector, comprising an outlet body and a first cover plate arranged separately, wherein the outlet body comprises a shaft section, a second cover plate, a conductive structure and a power supply conductor; the shaft section comprises an input end and an output end, the input end and the output end are oppositely arranged along an axial direction of the shaft section, wherein the input end is provided with an input terminal extending along the axial direction of the shaft section, and the output end is provided with an output terminal extending along the axial direction of the shaft section;

an end of the power supply conductor and the conductive structure are integrally formed in the shaft section, the conductive structure is electrically connected with the input terminal and the output terminal; an end of the power supply conductor is electrically connected with the input terminal, and another end of the power supply conductor passes through the shaft section; and the first cover plate is provided with a through hole, one of the input end or the output end passes through the through hole, and another one of the input end or the output end is connected with the second cover plate.

2. The aviation connector of claim 1, wherein the power supply conductor is a wire, and the wire comprises a neutral wire, a hot wire and a ground wire.

3. The aviation connector of claim 1, wherein the second cover plate is integrally formed on an outer peripheral surface of the shaft section.

4. The aviation connector of claim 1, further comprising a first waterproof cover arranged at the input end, the first waterproof cover comprises a first connecting belt and a first cover body, the first connecting belt connects a sidewall of the shaft section and the first cover body, and the first cover body is able to be folded and sealed at the input end.

5. The aviation connector of claim 4, wherein an end of the first connecting belt is provided with a first connecting sleeve, and the first connecting sleeve is provided on the outer peripheral surface of the shaft section.

6. The aviation connector of claim 4, wherein the input end is provided with an input hole extending along the axial direction of the shaft section, and a first annular gap is arranged between an inner wall of the input hole and the input terminal; and a first connecting ring is arranged on an end face of the first cover body, the first connecting ring is convex, and a central line of the first connecting ring is parallel to a central axis of the shaft section; the first connecting ring is able to be clamped in the first annular gap.

7. The aviation connector of claim 1, further comprising a second waterproof cover arranged at the output end, wherein the second waterproof cover comprises a second connecting belt and a second cover body, the second connecting belt connects the sidewall of the shaft section and the second cover body, and the second cover body is able to be folded and sealed at the output end.

8. The aviation connector of claim 7, wherein an end of the second connecting belt is provided with a second connecting sleeve, and the second connecting sleeve is sleeved on the outer peripheral surface of the shaft section.

9. The aviation connector of claim 7, wherein the output end is provided with an output hole extending along the axial direction of the shaft section, and a second annular gap is arranged between an inner wall of the output hole and the output terminal; and a second connecting ring is arranged on an end face of the second cover body, and a central line of the second connecting ring is parallel to the central axis of the shaft section; the second connecting ring is able to be clamped in the second annular gap.

10. A display screen, comprising a plurality of unit display screens and a plurality of aviation connectors of claim 1, wherein a housing of each unit display screen is provided with the aviation connector, and the power supply conductor of each aviation connector is electrically connected with the input end of an internal power supply of the unit display screen; and along an arrangement direction of the plurality of aviation connectors, the input end of the first aviation connector is electrically connected with an external power supply, and the output end of the first aviation connector is electrically connected with the input end of the aviation connector on the next unit display screen; the input end of the last aviation connector is electrically connected with the output end of the aviation connector on the last unit display screen.

* * * * *